United States Patent [19]

Köhler et al.

[11] Patent Number: 5,464,667
[45] Date of Patent: Nov. 7, 1995

[54] JET PLASMA PROCESS AND APPARATUS

[75] Inventors: Günter A. Köhler, Stillwater; Seth M. Kirk, Minneapolis; Gary J. Follett, St. Paul, all of Minn.

[73] Assignee: Minnesota Mining and Manufacturing Company, St. Paul, Minn.

[21] Appl. No.: 291,111

[22] Filed: Aug. 16, 1994

[51] Int. Cl.$^6$ .................................................. B05D 3/06
[52] U.S. Cl. .............................. 427/577; 118/50; 118/59; 118/68; 118/69; 118/723 E; 427/249; 427/255.2; 427/255.5; 427/294; 427/299; 427/398.2; 427/574
[58] Field of Search .................................... 427/577, 294, 427/249, 255.2, 299, 398.2, 574; 118/50, 59, 69, 723 E

[56] References Cited

U.S. PATENT DOCUMENTS

| | | | |
|---|---|---|---|
| 3,503,859 | 3/1970 | Goncarovs et al. | 204/165 |
| 3,569,661 | 3/1971 | Ebrling | 219/121 |
| 3,585,434 | 6/1971 | Kato et al. | 313/161 |
| 3,641,973 | 2/1972 | Shrader | 118/49 |
| 3,652,325 | 3/1972 | d'A Hunt | 117/107 |
| 3,754,117 | 8/1973 | Walter | 219/383 |
| 3,783,227 | 1/1974 | Aitken | 219/121 |
| 3,883,679 | 5/1975 | Shrader et al. | 13/31 |
| 4,006,268 | 2/1977 | Kennedy et al. | 427/42 |
| 4,013,532 | 3/1977 | Cormia et al. | 204/192 |

(List continued on next page.)

FOREIGN PATENT DOCUMENTS

| | | |
|---|---|---|
| 0299754 | 1/1989 | European Pat. Off. . |
| 0569771 | 11/1993 | European Pat. Off. . |
| 58-162194 | 9/1983 | Japan . |
| 924063 | 4/1982 | U.S.S.R. . |

OTHER PUBLICATIONS

R. L. Berger et al., "A Stopped–Flow Mixer Device for a Batch Microcalorimeter Application to NAD–NADase reaction", *Journal of Biochemical and Biophysical Methods*, 18 (1989) pp. 113–124 (No Month Avail.).

L. Ya. Alimova et al., "Effects of Thin Carbon Films on the Selective Gas Permeability Of A Polymer Membrane", *Journal of Engineering Physics*, vol. 48, No. 1 (Jul. 1985) pp. 78–81.

M. Hilden et al., "Sputtered Carbon on Particulate Media", *IEEE Transactions on Magnetics*, vol. 26, No. 1 (Jan. 1990) pp. 174–178.

L. Bardos et al., "High Rate Jet Plasma–Assisted Chemical Vapour Deposition", *6th International Conference on Ion and Plasma Assisted Techniques, Brighton, UK, May, 1987*.

B. Singh et al., "Hollow Cathode Plasma Assisted Chemical Vapor Deposition of Diamond", (Clean/Readable Copy Ordered Aug. 22) (No Month Avail.).

N. Koshino et al., *Diamond & Diamond–Like Material Synthesis Extended Abstracts of the 1988 Spring Meeting of the Materials Research Society*, Apr. 5–9, 1988, pp. 95–99.

S. Matsumoto et al.; "Deposition of Diamond From Thermal Plasma", *Diamond & Diamond–Like Material Synthesis Extended Abstracts of the 1988 Spring Meeting of the Materials Research Society*, Apr. 5–9, 1988, pp. 119–123.

Primary Examiner—Bernard Pianalto
Attorney, Agent, or Firm—Gary L. Griswold; Walter N. Kirn; Carole Truesdale

[57] ABSTRACT

A process and apparatus for the plasma deposition of a carbon-rich coating onto a substrate is provided. This method includes the steps of: providing a substrate in a vacuum chamber; and generating a carbon-rich plasma in the vacuum chamber by injecting a plasma gas into a hollow cathode slot system containing a cathode made of two electrode plates arranged parallel to each other, providing a sufficient voltage to create and maintain a carbon-rich plasma in the hollow cathode slot system, and maintaining a vacuum in the vacuum chamber sufficient for maintaining the plasma. The plasma is deposited on the substrate to form a carbon-rich coating.

30 Claims, 6 Drawing Sheets

U.S. PATENT DOCUMENTS

| | | | |
|---|---|---|---|
| 4,046,659 | 9/1977 | Cormia et al. | 204/192 |
| 4,065,097 | 12/1977 | Timin | 251/228 |
| 4,166,018 | 8/1979 | Chapin | 201/192 |
| 4,382,100 | 5/1983 | Holland | 427/38 |
| 4,407,712 | 10/1983 | Henshaw et al. | 204/290 |
| 4,434,188 | 2/1984 | Kamo et al. | 427/39 |
| 4,449,286 | 5/1984 | Dahlberg | 29/572 |
| 4,457,949 | 7/1984 | Takasaki et al. | 427/39 |
| 4,486,286 | 12/1984 | Lewin et al. | 204/192 |
| 4,490,229 | 12/1984 | Mirtich et al. | 204/192 |
| 4,526,833 | 7/1985 | Burguette et al. | 428/336 |
| 4,551,216 | 11/1985 | Argyo | 204/192 |
| 4,569,738 | 2/1986 | Kieser et al. | 204/173 |
| 4,603,082 | 7/1986 | Zelez | 428/336 |
| 4,645,977 | 2/1987 | Kurokawa et al. | 315/111 |
| 4,661,409 | 4/1987 | Kieser et al. | 428/408 |
| 4,663,183 | 5/1987 | Ovshinsky et al. | 427/39 |
| 4,666,784 | 5/1987 | Inukai et al. | 428/425 |
| 4,698,256 | 10/1987 | Giglia et al. | 428/216 |
| 4,702,963 | 10/1987 | Phillips et al. | 428/426 |
| 4,717,622 | 1/1988 | Kurokawa et al. | 428/408 |
| 4,725,345 | 2/1988 | Sakamoto et al. | 204/192 |
| 4,755,426 | 7/1988 | Kokai et al. | 428/336 |
| 4,756,964 | 7/1988 | Kincaid et al. | 428/408 |
| 4,767,608 | 8/1988 | Matsumoto et al. | 423/446 |
| 4,770,940 | 9/1988 | Ovshinsky et al. | 428/408 |
| 4,772,513 | 9/1988 | Sakamoto et al. | 428/408 |
| 4,780,354 | 10/1988 | Nakayama et al. | 428/141 |
| 4,794,047 | 12/1988 | Funamoto | 428/408 |
| 4,804,590 | 2/1989 | Nakamura et al. | 428/408 |
| 4,820,584 | 4/1989 | Morita et al. | 428/336 |
| 4,833,031 | 5/1989 | Kuokawa et al. | 428/336 |
| 4,838,199 | 12/1989 | Felts | 427/10 |
| 4,847,469 | 7/1989 | Hofmann et al. | 219/273 |
| 4,861,662 | 8/1989 | Kobliska et al. | 428/408 |
| 4,932,331 | 6/1990 | Kurihara et al. | 106/286 |
| 4,935,303 | 6/1990 | Ikoma et al. | 428/408 |
| 4,958,591 | 9/1990 | Yamazaki | 118/723 |
| 5,016,565 | 5/1991 | Saitoh et al. | 118/723 |
| 5,017,403 | 5/1991 | Pang et al. | 427/39 |
| 5,052,339 | 10/1991 | Vakerlis et al. | 118/723 |
| 5,068,124 | 11/1991 | Batey et al. | 427/39 |
| 5,091,208 | 2/1992 | Pryor | 427/38 |
| 5,104,509 | 4/1992 | Buck et al. | 204/192 |
| 5,182,132 | 1/1993 | Murai et al. | 427/577 |
| 5,185,179 | 2/1993 | Yamazaki et al. | 427/601 |
| 5,198,263 | 3/1993 | Stafford et al. | 427/577 |
| 5,204,145 | 4/1993 | Gasworth | 427/577 |
| 5,230,931 | 7/1993 | Yamazaki et al. | 427/569 |
| 5,232,791 | 8/1993 | Kohler et al. | 428/694 |
| 5,238,705 | 8/1993 | Hayashi et al. | 427/122 |
| 5,270,028 | 12/1993 | Tanabe et al. | 423/446 |
| 5,286,534 | 2/1994 | Kohler et al. | 427/577 |

JET PLASMA PROCESS AND APPARATUS

FIELD OF THE INVENTION

The present invention relates to carbon coatings, specifically to a method and apparatus for the plasma deposition of carbon-rich coatings.

BACKGROUND OF THE INVENTION

Carbon-rich coatings can be quite hard, chemically inert, corrosion resistant, and impervious to water vapor and oxygen. Thus, they are often used as mechanical and chemical protective coatings on a wide variety of substrates. For example, carbon-rich coatings have been applied to rigid disks and flexible magnetic media. They have also been applied to acoustic diaphragms, polymeric substrates used in optical and ophthalmic lenses, as well as electrostatic photographic drums.

Carbon-rich coatings, as used herein, contain at least 50 atom percent carbon, and typically about 70–95 atom percent carbon, 0.1–20 atom percent nitrogen, 0.1–15 atom percent oxygen, and 0.1–40 atom percent hydrogen. Such carbon-rich coatings can be classified as "amorphous" carbon coatings, "hydrogenated amorphous" carbon coatings, "graphitic" coatings, "i-carbon" coatings, "diamond-like" coatings, etc., depending on their physical and chemical properties. Although the molecular structures of each of these coating types are not always readily distinguished, they typically contain two types of carbon-carbon bonds, i.e., trigonal graphite bonds ($sp^2$) and tetrahedral diamond bonds ($sp^3$). They can also contain carbon-hydrogen bonds and carbon-oxygen bonds, etc. Depending on the amount of noncarbon atoms and the ratio of $sp^3/sp^2$ bonds, different structural and physical characteristics can be obtained.

Diamond-like carbon-rich coatings have diamond-like properties of extreme hardness, extremely low electrical conductivity, low coefficients of friction, and optical transparency over a wide range of wavelengths. They can be hydrogenated or nonhydrogenated. Diamond-like carbon coatings typically contain noncrystalline material having both trigonal graphite bonds ($sp^2$) and tetrahedral diamond bonds ($sp^3$); although it is believed the $sp^3$ bonding dominates. Generally, diamond-like coatings are harder than graphitic carbon coatings, which are harder than carbon coatings having a large hydrogen content, i.e., coatings containing hydrocarbon molecules or portions thereof.

Methods for preparing coatings by plasma deposition, i.e., plasma-assisted chemical vapor deposition, are known; however, some of these methods have deficiencies. For example, with certain methods the use of high gas flow, pressure, and power can cause formation of carbon powder, instead of the desirable smooth, hard carbon film. U.S. Pat. Nos. 5,232,791 (Kohler et al., Aug. 3, 1993) and 5,286,534 (Kohler et al., Feb. 15, 1994) disclose a process for the plasma deposition of a carbon-rich coating that overcomes some of these deficiencies. This process uses a carbon-rich plasma, which is generated from a gas, such as methane, ethylene, methyliodide, methylcyanide, or tetramethylsilane, in an elongated hollow cathode, i.e., a tubular cathode typically having a length to diameter ratio of 15:1 to 1:1. The plasma is accelerated toward a substrate exposed to a radio frequency bias. Although this process represents a significant advancement in the art, other plasma deposition processes are needed for deposition of a wide variety of carbon-rich coatings using lower energy requirements.

SUMMARY OF THE INVENTION

The present invention provides a process for the plasma deposition of a carbon-rich coating onto a substrate comprising:

(a) providing a substrate in a vacuum chamber;

(b) generating a carbon-rich plasma in the vacuum chamber by:

(1) injecting a plasma gas into a hollow cathode slot system containing a cathode comprising two electrode plates arranged parallel to each other;

(2) providing a sufficient voltage to create and maintain a carbon-rich plasma in the hollow cathode slot system; and (3) maintaining a vacuum in the vacuum chamber sufficient for maintaining the plasma; and (c) depositing the carbon-rich plasma on the substrate to form a carbon-rich coating.

The hollow cathode slot system contains two plates in a parallel orientation. These plates create a "slot" in which a stable plasma is generated. Thus, this conformation is referred to herein as a hollow cathode slot. The slot is generally rectangular in shape and has a length to width ratio of less than 1:1. That is, the space between the plates is wider than it is long, as distinguished from a "tube" or an elongated hollow cathode in which the length to diameter ratio is at least 1:1 and generally greater than this. This configuration provides significant advantage in several ways as discussed below. In this context, the length of the cathode is the distance between the inlet for the gases and the outlet for the plasma.

The hollow cathode slot system preferably includes a first compartment having therein a hollow cathode tube, a second compartment connected to the first compartment, and a third compartment connected to the second compartment having therein the two parallel plates. The plasma gas includes a feed gas, preferably a combination of a feed gas and a carrier gas; the carrier gas being injected into the first compartment and the feed gas being injected into the second compartment for mixing with the carrier gas.

Although the voltage can be applied using a nonpulsating filtered DC power supply or a pulsating DC power supply, in particularly preferred embodiments, the voltage is provided by a first pulsating DC power supply connected to the hollow cathode tube and a second pulsating DC power supply connected to the two electrode plates, i.e., the hollow cathode slot.

The plasma is preferably deposited on the substrate while the substrate is in close proximity to a radio frequency bias means, and more preferably while the substrate is in contact with the radio frequency bias means. The radio frequency bias means draws the plasma toward the substrate, thereby accelerating the plasma toward the substrate for efficient and rapid deposition. The use of the radio frequency bias means also contributes to the formation of harder carbon-rich coatings. The radio frequency bias means is preferably a chill roll.

In preferred embodiments, the plasma is directed past an anode system, which is preferably connected to both pulsating DC power supplies, on its way toward the substrate. In particularly preferred embodiments, the plasma is directed past an adjustable anode system.

The present invention also provides a jet plasma deposition apparatus comprising a cathode system for generating a plasma and an anode system. The cathode system is a hollow cathode slot system containing a compartment having therein a cathode comprising two electrode plates arranged parallel to each other. Preferably, the hollow cathode slot system includes a first compartment having therein a hollow cathode tube, a second compartment connected to the first compartment, and a third compartment connected to the second compartment and having therein two parallel electrode plates. This cathode system is preferably used in combination with an anode system and two pulsating DC power supplies, wherein the hollow cathode tube is connected to a first pulsating DC power supply and the two electrode plates are connected to a second pulsating DC power supply. The anode system can be any type of system that functions as an anode. Preferably, it is an adjustable anode system as described herein.

Furthermore, the present invention provides a jet plasma deposition apparatus comprising a cathode system (preferably a hollow cathode slot system) for generating a plasma and an adjustable anode system located substantially below the path the plasma travels when in operation. Preferably, this system, as well as the system described in the previous paragraph, includes a bias electrode and the adjustable anode is located substantially below an imaginary line connecting the slot of the hollow cathode slot system and the bias electrode so as to be below the path of the plasma as it travels between the cathode and the bias electrode when in operation.

DETAILED DESCRIPTION OF THE INVENTION

The present invention provides a method and apparatus for depositing carbon-rich coatings by means of jet plasma deposition. In general, the process of the present invention uses a carbon-rich plasma (i.e., expanded gaseous reactive ionized and neutral hydrocarbon fragments) that is directed in a jet stream toward a substrate. Generally, the substrate is negatively charged as a result of being exposed to a radio frequency bias. The carbon-rich plasma is generated from a plasma gas using a hollow cathode system, i.e., either a "hollow cathode tube" or a "hollow cathode slot," preferably a slot, and more preferably a tube in line with a slot, and then directed toward and typically past an anode. This is in contrast to conventional "plasma jet" systems in which the plasma is generated between the cathode and anode and a jet stream is directed out of the cathode/anode arrangement.

The plasma gas may be gaseous or a vaporized liquid. It includes a feed gas and optionally a carrier gas, such as argon. Preferably, the plasma gas includes both a feed gas and a carrier gas. The feed gas is any suitable source for the desired composition of the carbon rich-coating. The carbon-rich coatings deposited from the carbon-rich plasma generally provide a substantially impervious barrier to water vapor and oxygen. Furthermore, the coatings are generally resistant to mechanical and chemical degradation. For example, they are sufficiently elastic such that they can be used on typical flexible substrates used in, for example, magnetic media and packaging films.

Figure 1:
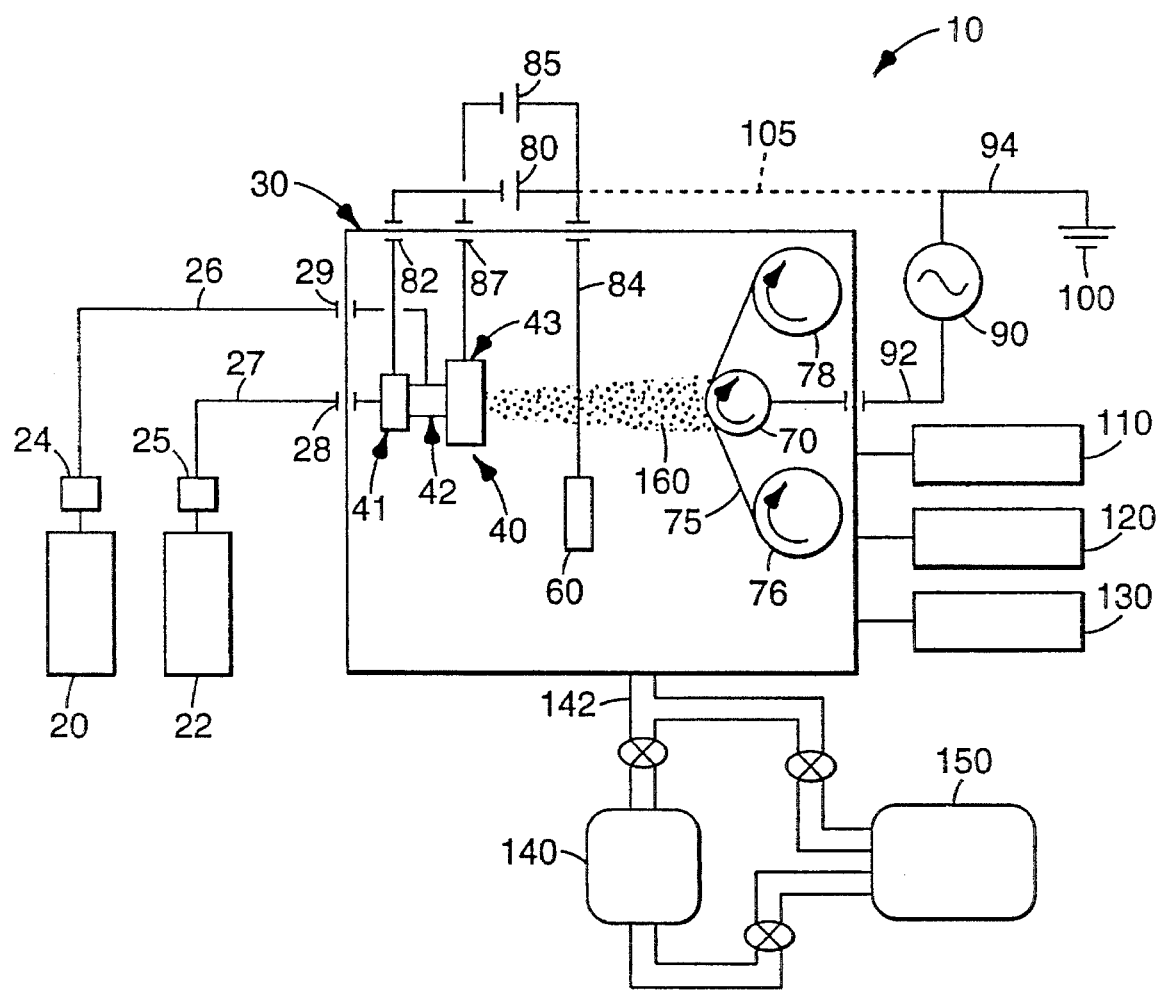
FIG. 1 is a schematic diagram of a jet plasma vapor deposition apparatus of the present invention.

Referring to FIG. 1, a particularly preferred jet plasma apparatus for deposition of such carbon-rich coatings, generally indicated as 10, is shown. The apparatus includes feed gas source 20 and carrier gas source 22 connected via flow controllers 24 and 25, respectively, to inlet tubes 26 and 27, respectively. Carrier gas, e.g., argon, from the gas source 22 is fed into a vacuum chamber 30 and into a hollow cathode system 40 through an inlet port 28. Feed gas, e.g., acetylene, from the gas source 20 is fed into the vacuum chamber 30 and into the hollow cathode system 40 through an inlet port 29. The preferred hollow cathode system 40 is divided into three compartments, i.e., a first compartment 41, a second compartment 42, and a third compartment 43. The carrier gas, if used, is fed into the first compartment 41, whereas the feed gas is fed into the second compartment 42.

In addition to the hollow cathode system 40, inside the vacuum chamber 30 is an anode system 60, preferably an adjustable anode system, which can also act as a grounding system, a radio frequency bias electrode 70, and a substrate (e.g., polyester film such as polyethylene terephthalate "PET") 75. The substrate 75 is generally unwound from a first roll 76 and is rewound upon a second roll 78. The plasma gas, i.e., feed gas alone or mixture of feed gas and carrier gas, is converted into a carbon-rich plasma within the hollow cathode system 40. The carbon-rich plasma is then directed toward the substrate 75, which preferably contacts the radio frequency bias electrode 70 during deposition of the carbon-rich coating from the carbon-rich plasma. The substrate can be made of any material that can be coated with a carbon-rich coating. For example, it can be a polymeric, metallic, or ceramic substrate. In a preferred embodiment, the substrate is a thin, i.e., less than 20 mil (0.05 cm) and flexible polymeric film. Examples of useful films are oriented polyester, nylon, biaxially oriented polypropylene, and the like.

The radio frequency bias electrode 70 is made of metal, such as copper, steel, stainless steel, etc., and is preferably in the form of a roll, although this is not necessarily a requirement. For example, it can be in the form of a plate. The roll is advantageous, however, because it reduces friction between the electrode and the substrate, thereby reducing film distortion. More preferably, the radio frequency bias electrode 70 is water-cooled to a temperature no greater than about room temperature, preferably to a temperature of about 0°–5° C., which is advantageous when heat-sensitive substrates are used. The radio frequency bias electrode typically has a frequency of about 25 KHz to about 400 KHz, although it is possible to increase the frequency range up to and including the megahertz range. It typically has a bias voltage of about minus 100 volts to about minus 1500 volts. With the bias voltage, an additional plasma is created in the proximity of the radio frequency bias electrode 70 that applies a negative potential to the substrate, and draws the plasma 160 toward the substrate 75 for efficient and rapid deposition.

To create the carbon-rich plasma, a first DC power supply 80 is electrically connected directly to the first compartment 41 of the hollow cathode system 40 by a circuit 82 and to the anode system 60 by a circuit 84. The first DC power supply 80 can be a pulsating DC power supply, a nonpulsating filtered DC power supply, or other plasma-generating means with appropriate arc suppression, such as those used in sputtering systems. A pulsating DC power supply is generally preferred, however. Also, a second DC power supply 85 is electrically connected directly to the third compartment 43 of the hollow cathode system 40 by a circuit 87 and to the anode system 60 also by circuit 84. The second DC power supply 85 can be a pulsating DC power supply, a nonpulsating filtered DC power supply, or other plasma-generating means with appropriate arc suppression, although a pulsating DC power supply is preferred. An example of a nonpulsating filtered DC power supply is a 25 kilowatt filtered DC power supply, such as that available from Hippotronics Inc., New York, N.Y. Such a power supply generates a plasma at high currents up to about 10 amperes, and relatively low voltage, i.e., about minus 100 volts.

An RF biasing power supply 90 (e.g., Plamsaloc 3 power supply from ENI Power Systems, Inc., Rochester, N.Y.) is connected to the radio frequency bias electrode 70 by a circuit 92 and to a ground 100 by a circuit 94. The DC power supplies 80 and 85 can also be connected to the ground 100, although this is not a preferred arrangement. This electrical connection is represented in FIG. 1 by the dashed line 105. Thus, in this arrangement wherein all three power supplies are attached to ground 100, the anode system 60 is grounded. The former arrangement, wherein the anode system 60 is not grounded, is advantageous when compared to the latter arrangement. For example, when the anode system 60 is not grounded, the plasma formed is more stable, at least because the plasma sees the anode system as distinct from the grounded metal chamber. Also, when the anode system 60 is not grounded, the cross-web coating thickness, i.e., the coating thickness along the width of the substrate, is more uniform. Furthermore, the plasma is more confined and the pattern of deposition can be more readily controlled by varying the exposure of the plasma to the anode system 60, as explained in further detail in the examples.

As stated above, DC power supplies 80 and 85 are preferably pulsating DC power supplies. This is because pulsating DC power supplies provide more stable plasma conditions than nonpulsating DC power supplies, which contributes to uniform plasma deposition rates and therefore down-web, i.e., along the length of the substrate, coating uniformity. Furthermore, they allow for the use of high current flow, and thus high deposition rates, at relatively low voltage.

Whether used as the first DC power supply 80 or the second DC power supply 85, or both, a preferred pulsating DC power supply is one that provides a voltage that typically passes through zero about 25–1000 times/second, more preferably about 25–200 times/second, and most preferably about 100–120 times/second. This allows the plasma to extinguish and then reignite as the cathode reaches its necessary potential. Examples of such pulsating DC power supplies include the Airco Temescal Model CL-2A power supply with a 500 mA maximum output and a 120 Hz full-wave rectified DC voltage from 0 to minus 5000 volts, available from Airco Temescal, Berkeley, Calif. Another version of this power supply uses two Airco Temescal transformers in parallel, thereby resulting in a 1 ampere maximum output. These pulsating DC power supplies were used in the examples described below. Another power supply was built with a 10 ampere maximum output, and also used in the examples described below. This was accomplished with a larger size (1 kilowatt), leakage-type transformer obtained from MAG-CON Inc., Roseville, Minn., including full wave rectification to achieve pulsating DC output. As used herein, a "leakage-type" transformer is one that provides a stable operating point for a load with a negative dynamic resistance. Typical output of this 10 ampere power supply is 0 to minus 1500 VDC (volts direct current) with current of 0 to 10 amperes. This power supply is current limited, which prevents formation of high intensity arcs at the cathode surfaces. If greater currents are required, a larger leakage-type transformer can be used, or two or more smaller transformers can be arranged in parallel.

In particularly preferred embodiments of the present invention, both power supply 80 and power supply 85 are pulsating DC power supplies. In such embodiments, a carrier gas is injected into the first compartment 41 of the hollow cathode system 40 and a pulsating DC power supply, preferably a 500 mA pulsating DC power supply, is used to create a plasma from the carrier gas. Although formation of this initial carrier gas plasma may not always be necessary when a pulsating DC power supply is used to generate a plasma in the third compartment 43 of the hollow cathode system 40, it is necessary for ignition of a plasma in the third compartment when a nonpulsating filtered DC power supply is used. After initial ignition of the carrier gas plasma in particularly preferred embodiments of the present invention, this initial plasma passes into the second compartment 42 of the hollow cathode system 40 where it is mixed with the feed gas. This mixture then passes into the third compartment 43 where a second plasma is created using a pulsating DC power supply. This pulsating DC power supply can be a 1 ampere or 10 ampere power supply, as used in the examples, or it can be a 500 mA power supply or a 20 ampere, 30 ampere, 50 ampere, 100 ampere, etc., power supply, depending on the desired feed gas fragment concentration and carbon coating deposition rate.

In the first compartment 41 of the hollow cathode slot system 40, the voltage created and maintained is preferably about minus 200 to about minus 1000 volts, preferably about minus 200 to about minus 500 volts. The power supplied to this first compartment is typically about 20–10,000 watts, preferably about 20–1000 watts, and more preferably about 100–500 watts. In the third compartment 43 of the hollow cathode slot system 40, the voltage created and maintained is preferably about minus 50 to about minus 500 volts, and more preferably about minus 80 to about minus 120 volts. The power supplied to this second compartment is typically about 50–3000 watts, and more preferably about 1000–3000 watts. In experiments described below using two pulsating DC power supplies, typical parameters in the first compartment include a plasma current of 0.5 ampere and a plasma voltage of about minus 500 volts, and typical parameters in the third compartment include a plasma current of 1 or 10 amperes and a plasma voltage of minus 100 volts.

Given the correct conditions, a stable jet plasma 160 is formed in the vacuum chamber which spreads out in an extended pattern generally imaging the shape of the exit slot of the hollow cathode slot system 40. Preferred plasmas have a high feed gas fragment concentration, i.e., fragmentation of the feed gas occurs at a high rate, so as to provide a rapid deposition rate of the carbon-rich coating on the substrate 75. That is, the higher the deposition rate of a carbon-rich coating and the more uniform the coating, the more desirable the plasma formed, which depends on the system arrangement and the current and voltage provided. Furthermore, if a highly uniform carbon-rich coating can be deposited at a relatively high rate with low power requirements, the more desirable the system with respect to practical considerations (e.g., cost, safety, and preventing overheating).

To monitor the conditions in the vacuum chamber 30, a mass spectrometer 110, an emission spectrometer 120, and a capacitance manometer 130 can be provided, and connected to the vacuum chamber 30. A vacuum can be created and maintained within the vacuum chamber 30 by any means typically used to create a vacuum. For example, in the embodiment represented by FIG. 1, a diffusion pump 140 and a mechanical pump 150 are used, which are connected to the chamber 30 by means of a vacuum inlet 142. The vacuum chamber is typically maintained at a pressure of about 1–300 mTorr (0.13–40 Pa), preferably at about 5–50 mTorr (0.67–67 Pa).

Figure 2:
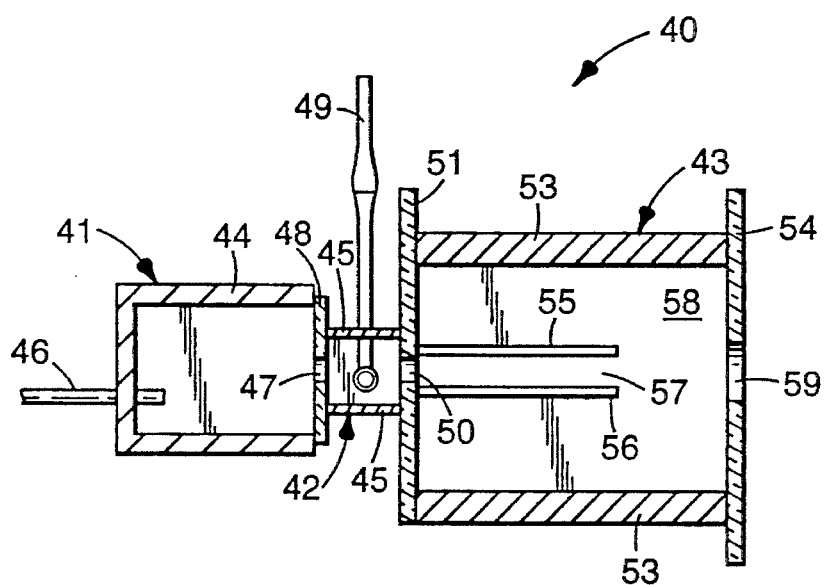
FIG. 2 is a cross-sectional side view of a preferred hollow cathode slot system of the present invention.

As stated above, the preferred hollow cathode system 40 consists of three compartments in series, i.e., a first compartment 41, a second compartment 42, and a third compartment 43. Referring to FIG. 2, the first compartment 41 consists of walls 44 open to the second compartment 42. Although the walls 44 are preferably made of copper, they can be made of any high temperature-resistant conductive material, such as graphite or any metal, e.g., molybdenum, tungsten, or tantalum. Preferably, at least the top and bottom walls are water-cooled so there is little or no heat of expansion, thereby allowing the electrical conditions to be generally constant. If the walls are graphite, however, water-cooling is not necessary. The walls are preferably cooled to room temperature or below, and more preferably to a temperature of about 0°–5° C. The dimensions of the first compartment 41 are typically about 2–20 cm in width, length, and height, although there is no specific size limitation. Furthermore, although the shape is shown as being rectangular, the compartment can be in the form of a cylinder or other desired configuration.

The first compartment 41 is designed so that it can sustain a plasma of the carrier gas, e.g., argon. The carrier gas enters the first compartment 41 through an elongated passageway 46 that acts as a hollow cathode. Therein, the carrier gas is converted to a plasma, if desired. Thus, this compartment can be referred to as the argon plasma chamber. This elongated passageway is preferably in the shape of a tube, which can be made of any highly conductive refractory material, such as graphite, molybdenum, tungsten, or tantalum and have any of a variety of cross-sectional configurations, e.g., circular, square, rectangular, etc. Preferably, the tube is made of graphite and is circular in cross-section with a length to diameter ratio ranging from about 10:1 to about 5:1. The internal diameter is about 0.3 cm to about 2.5 cm, preferably about 0.5–1.5 cm. Such hollow cathode tubes are described in further detail in U.S. Pat. Nos. 5,232,791 and 5,286,534 (Kohler et al.), which are incorporated herein by reference. Both the graphite tube and the copper walls are connected to the same DC power supply, i.e., DC power supply 80 (FIG. 1). Although the cathode in the first compartment 41 shown in FIG. 2 is in the shape of a circular tube, this is not necessarily a requirement, although it is advantageous, at least because this configuration makes it easier to generate and maintain a stable plasma.

The plasma generated in the hollow cathode in the first compartment passes into the second compartment 42, which consists of walls 45. Preferably, the carrier gas plasma enters into compartment 42 through an opening 47 in a dividing plate 48. In the second compartment 42, the carrier gas plasma is mixed with the feed gas, which enters through a feed gas inlet tube 49. This mixture then passes into the third compartment 43, preferably through an opening 50 in a dividing plate 51. Thus, the second compartment 42 is a mixing chamber that is open to both the first compartment 41 and the third compartment 43. Although the walls 45, the feed gas inlet tube 49, the dividing plates 48 and 51, i.e., second compartment end plates, are preferably made of glass, e.g., quartz, they can be made of any electrically insulating material, e.g., ceramic. The opening 47 in plate 48, i.e., the dividing plate between the first and second compartments, is preferably circular-shaped having a diameter of about 0.3–2 cm, preferably about 0.5–1 cm. The opening 50 in plate 51, i.e., the dividing plate between the second and third compartments, is preferably in the shape of an oblong oval or rectangle, i.e., a slot, having a size that generally reflects, i.e., images, the dimensions of the opening between the electrode plates in the third compartment (discussed below). The feed gas inlet tube 49 is preferably in the shape of a "T" with exit ports at the ends of the cross-piece as well as along the length of the cross-piece to allow for better dispersion of the feed gas. The dimensions of the second compartment 42 are typically about 2–200 cm in width, length, and height, although there is no specific size limitation. Furthermore, although the shape is shown as being rectangular, the compartment can be in the form of a cylinder or other desired configuration.

The third compartment 43 consists of walls 53 and a front plate 54, although this front plate 54 is not a necessary requirement for the hollow cathode slot system 40 to function. The front plate 54 is preferably made of glass, e.g., quartz, although other electrically insulating materials can be used, e.g., ceramic. The walls 53 are preferably made of graphite, although they can be made of copper or any refractory metal, e.g., molybdenum, tungsten, or tantalum, so as to withstand elevated temperatures. If the walls are not made of graphite, at least the top and bottom walls are preferably water-cooled to the same temperature as that discussed above for the first compartment 41. The dimensions of the third compartment 43 are typically about 5 cm to about 200 cm in width, length, and height, although there is no specific size limitation. Furthermore, although the shape is shown as being rectangular, the compartment can be in the form of a cylinder or other desired configuration. Typical dimensions for this compartment are 10 cm high, 10 cm long, and 15–30 cm wide, but this depends on the width of the substrate being coated.

The third compartment 43 also includes two electrode plates 55 and 56 arranged parallel to each other with a gap 57. The plates are connected to a second DC power supply 85 (FIG. 1) to generate a plasma between the electrode plates. The plasma is jetted into the forward section 58 of the third compartment 43 and directed in line of sight through a slot 59 in front plate 54 onto the substrate.

The parallel plates 55 and 56 act as a cathode and are made of either graphite or any high temperature-resistant conductive material such as copper or refractory metals. Preferably, they are made of graphite because the arc discharge of the plates results in some ablation of the plates, which causes carbon deposition on the substrate when only a carrier gas is used in the formation of the plasma. The electrode plates 55 and 56 are placed tightly against the dividing plate 51 so that the plasma gas, e.g., mixture of a carbon-rich feed gas and carrier gas plasma, are introduced through slot 50 directly into the space between the electrode plates 55 and 56, i.e., gap 57. The length (i.e., the dimension between the end of the plates where the gases enter at slot 51 and the end of the plates where the plasma exits into the forward section 58) of the electrode plates is chosen such that a stable plasma is generated and little or no carbon is deposited on the plates themselves. Typically, this is about 0.3–10 cm, although this can vary depending on the pressures of the gases. The length of the electrode plates is less than their width. Preferably, the length of the electrode plates is about half the length of the third compartment. The thickness of the electrode plates 55 and 56 is typically about 0.05–1 cm, preferably about 0.3–0.6 cm. The width of the electrode plates 55 and 56 does not affect the formation of the plasma, but is chosen depending upon the width of the substrate to be coated. Thus, the width of the electrode plates can be about 2–200 cm, or longer. The size of the gap 57 between plates 55 and 56 is chosen such that a stable plasma is generated, but the gap is not clogged. That is, the distance between electrode plates 55 and 56 is not so large that a plasma cannot be generated, nor is it so small that the gap is clogged by carbon depositions. Typically, the gap 57 between electrode plates 55 and 56 is about 0.3–2 cm, preferably about 0.6 cm. The dimensions of the opening 50, i.e., slot 50, in plate 51 typically are of the same dimensions as those of gap 57, i.e., about 0.3–2 cm, preferably about 0.6 cm high, and about 2–200 cm wide, again depending on the width of the substrate.

Thus, the cathode in the third compartment is referred to herein as the hollow cathode "slot." Also, a hollow cathode system that contains a hollow cathode slot, whether alone or in combination with another hollow cathode slot or with a hollow cathode tube, is referred to herein as a hollow cathode slot system. A hollow cathode slot is advantageous because it provides for confinement and directionality of the plasma. Furthermore, the "slot" conformation supports plasma from a wide range of currents at a generally constant and low voltage, thereby permitting generally high deposition rates without a tendency of overheating.

It is to be understood that one or more additional hollow cathode slot systems that generate carbon-rich plasmas as described herein may also be included within the apparatus shown in FIG. 1. The additional cathode(s) can provide more than one layer onto the substrate or can provide an increased rate of deposition of the carbon-rich layer.

The use of the preferred current-limited pulsating DC power supply combined with the hollow cathode slot system of the present invention is advantageous, at least because it produces a very stable plasma over an extended period of time, thereby resulting in generally high deposition rates and uniform coating thicknesses in the down-web direction. The plasma is caused by low intensity arcs moving randomly and constantly on the surface of both electrodes, and thus is generally uniformly distributed in between the electrode plates. Thus, the discharge that results from the use of the electrode plates is an arc discharge, as opposed to a glow discharge that results from the use of a tube, as described in U.S. Pat. Nos. 5,232,791 and 5,286,534 (Kohler et al.). This plasma mode appears to be the result of constant extinction and reignition of the plasma, which generally prevents arc freezing and favors excessive multiple arc formation.

Figure 3:
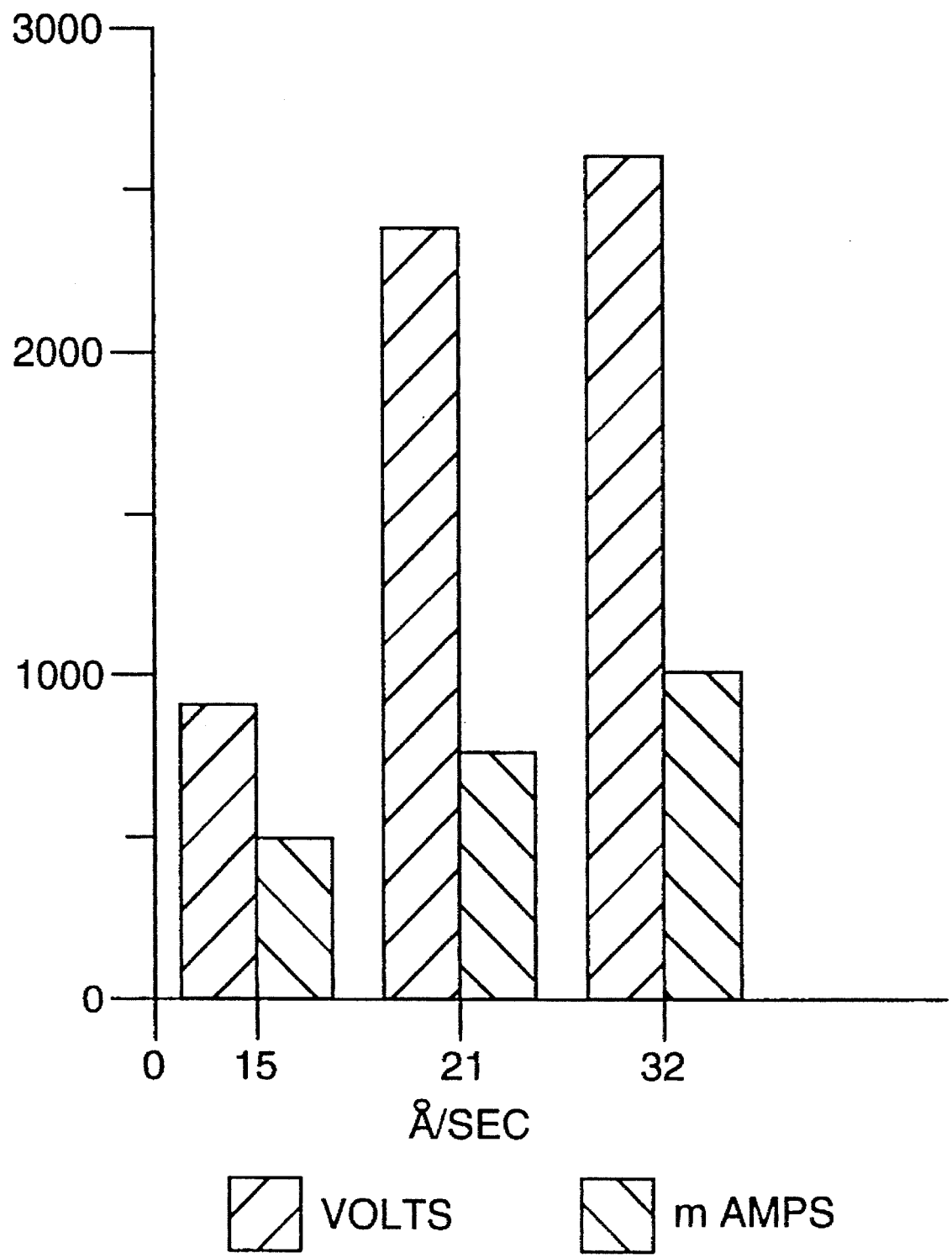
FIG. 3 are plots of power requirements and the resulting deposition rates of a hollow cathode tube (2.5 cm in diameter).

In contrast to only a hollow cathode tube, as described in U.S. Pat. Nos. 5,232,791 and 5,286,534 (Kohler et al.), or a combination of two such hollow cathode tubes, a hollow cathode slot, or a combination of a hollow cathode tube and a hollow cathode slot, as described herein, sustains a plasma at about minus 100 volts at a current as high as 10 amperes. Although the hollow cathode tube provides excellent carbon-rich coatings in a generally efficient manner, the behavior of the hollow cathode slot system described herein is unexpected and advantageous. The power requirements for a glow discharge and resulting deposition rates of a hollow cathode tube in preparing carbon-rich coatings are illustrated in FIG. 3. The experimental procedure is outlined in Example 2 (Comparative Example). From this it can be seen that the hollow cathode tube with a glow discharge requires a significant increase in voltage and, consequently, power as higher current is used to create higher deposition rates. For the hollow cathode slot system, however, high plasma current, and thus deposition rate, is achieved with marginal (i.e., about 100 volts) or no change in plasma voltage. See the results in Example 1. Consequently, the power rises only proportionally to the plasma current. This moderate power requirement and the use of low voltage makes the hollow cathode slot system unique and extremely practical for large scale operation. This is because the higher currents available at a given voltage with the hollow cathode slot system of the present invention results in a higher degree of fragmentation of the hydrocarbon feed gas (with lower power requirements), thereby resulting in higher deposition rates. Thus, the hollow cathode slot system of the present invention provides significant plasma stability, large width deposition, and the use of high plasma current to achieve high deposition rates.

The deposition rates of carbon coatings using the systems of the present invention are proportional to the current applied. These deposition rates are generally about 1–2 orders of magnitude higher than most previously reported deposition rates, e.g., 10–80 Å/second, and significantly higher than the deposition rate of 250 Å/second reported in U.S. Pat. No. 5,182,132 (Murai et al.). For example, deposition rates as high as about 750 Å/second can be obtained using the hollow cathode slot system of the present invention and the procedure described in Example 1. It is believed that even higher deposition rates can be achieved with higher current power supplies and higher gas flow rates.

Figure 4:
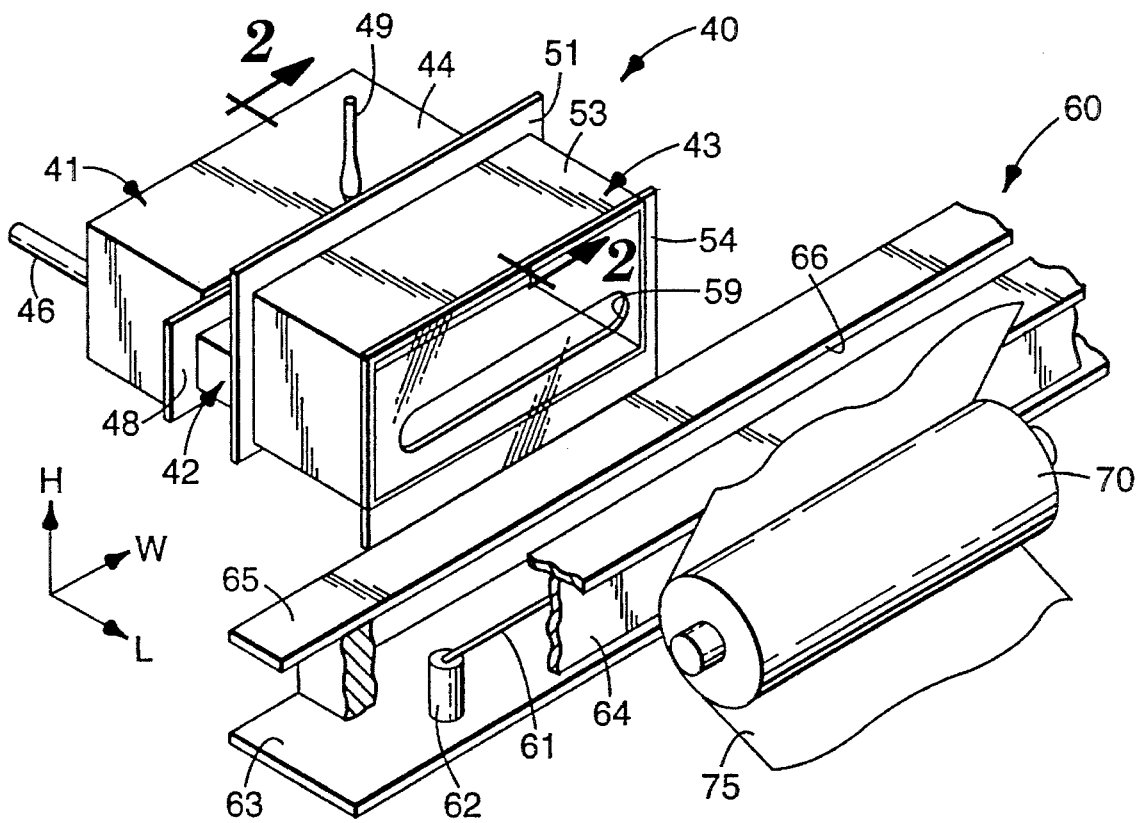
FIG. 4 is a cut-away view of a jet plasma vapor deposition apparatus with an adjustable anode system.

In addition to the hollow cathode slot system described above, and the pulsating DC power supplies, particularly preferred embodiments of the present invention include an anode system 60 (FIG. 1), preferably an adjustable anode system (FIG. 4). The anode system, particularly the adjustable anode system, contributes to the maintenance of a stable plasma, and to the uniformity of the carbon-rich coatings formed. Although the adjustable anode system is described herein in combination with the hollow cathode slot system of the present invention, this is not necessarily a requirement. The adjustable anode system can be used to advantage, for example, with the hollow cathode tube, which is shown in U.S. Pat. Nos. 5,232,791 and 5,286,534 (Kohler et al.), instead of the hollow cathode slot. Furthermore, any anode can be used with the preferred hollow cathode slot system to advantage as long as the plasma is generated in the cathode and directed toward and past the anode.

Referring to FIG. 4, the adjustable anode system 60 consists of an electrically conductive rod 61 that is positioned parallel to the cathode slot 59. The length of the rod 61 can exceed the length of the slot 59, preferably by up to about 30 cm. More preferably rod 61 and cathode slot 59 are aligned such that the rod extends beyond both ends of the slot by about 5 cm to about 15 cm. The anode system rod 61 is placed approximately half way between the hollow cathode slot 59 and the substrate 75, and a sufficient distance below (e.g., about 2–30 cm below, typically about 5 cm below) the path the plasma travels during operation to avoid blocking the plasma on its path from the slot to the substrate. Typically, this is about 2–30 cm below an imaginary line connecting the center of the hollow cathode slot 59 and the center of the bias electrode 70.

The anode system rod 61 consists of graphite, tungsten or any refractory metal, preferably graphite. It is preferably about 0.5–2 mm in diameter. It is tightly fastened at both ends to spacers 62, which are preferably about 1–3 cm in diameter. The anode system can be grounded by using spacers made of a conductive material, such as copper, aluminum, etc., preferably copper, and directly mounting the spacers 62 onto metal base plate 63, which is typically the base plate of the coating chamber, i.e., the vacuum chamber 30 (FIG. 1). Alternatively, the spacers 62 can be made of an insulating material to isolate the anode system.

The anode system rod 61 is enclosed in a glass box 64. The top side 65 of the box has a slot 66 parallel to the anode system rod 61. The slot 66 can vary in width, generally it is about 0.5–3 cm wide. The slot width variation is used to achieve optimal interaction between the hollow cathode slot system 40 and the anode system rod 61. That is, the slot width can be adjusted to vary the interaction between the cathode and anode (hence "adjustable anode system"), thereby affecting the plasma stability as well as the carbon deposition rates and the carbon coating cross-web uniformity. Optimum interaction between the cathode and anode is desirable to avoid any additional plasma grounding paths to grounded parts of the chamber.

During plasma operation the anode system rod 61 is at a temperature of about 750°–1250° C., preferably a temperature of about 1000° C., to ensure the conversion of incidentally deposited plasma carbon to conductive graphite and thus to sustain adequate electrical conductivity of the anode rod. While sufficient heating takes place at high plasma current, auxiliary resistive heating of the rod is desirable at lower plasma current. As shown below in Example 3, the cross-web coating thickness can be varied by varying the exposure of the plasma to the anode system rod 61. This is done by controlling the electric field between the cathode and anode, i.e., by blocking portions of the slot 66 of the anode system 60, and directing the plasma along the unblocked field. In this way, the anode system is adjustable, such that the cross-web coating thickness can be manipulated.

The process and apparatus of the present invention can be used to prepare any of a variety of carbon-rich coatings, such as amorphous coatings, and the like. Typical coatings made by the process and apparatus of the present invention contain greater than about 50 atom-% carbon (preferably about 70–95 atom-%), along with minor amounts of oxygen (preferably about 0.1–15 atom-%), nitrogen (preferably about 0.1–20 atom-%), and hydrogen (preferably about 0.1–40 atom-%), although the coatings formed need not contain any oxygen, nitrogen, or hydrogen. The composition of the carbon-rich coating can be controlled by means of the pressure of the carrier gas, the composition of the feed gas, the configuration of the hollow cathode, and the electrical power supplied by the DC and radio frequency power supplies. For example, by increasing the concentration of the carrier gas or by increasing the bias voltage, a coating with a higher carbon content can be formed.

As stated previously, the carbon-rich plasma is created from a feed gas or a mixture of a feed gas and a carrier gas. This is referred to herein as the "plasma gas." The carrier gas flow rate can be about 50–500 standard cubic centimeters (sccm), preferably about 50–100 sccm, and the feed gas flow rate can be about 100–60,000 sccm, preferably about 300–2000 sccm. For example, for carbon deposition rates of about 20–800 Å/second, the feed gas flow rate is about 50–350 sccm and the carrier gas flow rate is about 50–100 sccm, with higher feed gas flow rates in combination with lower carrier gas flow rates (typically resulting in higher deposition rates). Generally, for harder coatings, the carrier gas flow rate is increased and the feed gas flow rate is decreased.

The feed gas, i.e., the carbon source, can be any of a variety of saturated or unsaturated hydrocarbon gases. Such gases can also contain, for example, nitrogen, oxygen, halides, and silicon. Examples of suitable feed gases include, but are not limited to: saturated and unsaturated hydrocarbons such as methane, ethane, ethylene, acetylene, and butadiene; nitrogen-containing hydrocarbons such as methylamine and methylcyanide; oxygen-containing hydrocarbons such as methyl alcohol and acetone; halogen-containing hydrocarbons such as methyl iodide and methyl bromide; and silicon-containing hydrocarbons such as tetramethylsilane, chlorotrimethyl silane, and tetramethoxysilane. The feed gas can be gaseous at the temperature and pressure of use, or it can be an easily volatilized liquid. A particularly preferred feed gas is acetylene.

As stated previously, a carrier gas can also be used with the feed gas to advantage. For example, without the auxiliary plasma from the carrier gas the feed gas plasma is difficult to sustain at around minus 100 volts using either a pulsating or a filtered DC power supply. For example, when using only the feed gas, with a 1 ampere pulsating DC power supply the voltage rises occasionally up to about minus 1000 volts, and with a nonpulsating filtered 10 ampere power supply, the plasma is occasionally extinguished altogether.

The carrier gas can be any inert gas, i.e., a gas that is generally unreactive with the chosen feed gas under the conditions of pressure and temperature of the process of the present invention. Suitable carrier gases include, but are not limited to, helium, neon, argon, krypton, and nitrogen. Typically, higher molecular weight molecules, e.g., argon, are preferred. The terms "inert" and "carrier" are not meant to imply that such gases do not take part in the deposition process at all. Generally, it is believed that the generated carrier gas ions act as bombarding particles to remove the softer portions of the coatings, e.g., those portions containing a higher hydrogen atom content, and thereby improve the density and strength of the coatings.

The thickness of the carbon-rich coatings produced by the method of the present invention are typically greater than about 5 nm, preferably about 10–100 nm, more preferably about 10–40 nm, and most preferably about 10–20 nm. Thicker coatings are possible, but not typically needed. The substrate moves through the plasma at a rate designed to provide a coating of a desired thickness. The speed at which the substrate 75 travels from roll 76 to roll 78 can be about 10–4000 mm/second, but is typically about 10–1500 mm/second for the gas flow rates and pressures and the apparatus described above.

In summary, the hollow cathode slot system of the present invention, preferably in combination with a pulsating DC power supply, and more preferably in combination with the adjustable anode system described above, is advantageous because the plasma is confined and directional. The confinement contributes to the high deposition yield generally exclusively concentrated on the film substrate. The directionality, i.e., the directed diffusion, of the plasma is due in part to the gas or pressure gradient inside and outside the hollow cathode. This enhances the transport of the plasma to the substrate and thereby the rates of deposition. Furthermore, the hollow cathode slot system of the present invention, preferably in combination with a pulsating DC power supply, and more preferably in combination with the anode system described above, is advantageous because it allows for the use of high currents at low and generally constant voltages. This system also enables high fragmentation rates by employing high flow rates and accordingly high pressures inside the hollow cathode slot system. Significantly, powder formation of carbon, which is often associated with relatively high pressures, is not generally observed. Once the plasma is jetted out of the hollow cathode slot system, the pressure becomes sufficiently low such that deposition becomes possible at high bias voltages. The use of high bias voltages is generally used to tailor-make specific coating properties (e.g., hardness, adhesion, and conductivity) and/or to operate the process at high web speeds.

The present invention is further described by the following nonlimiting examples. These examples are offered to further illustrate the various specific and preferred embodiments and techniques. It should be understood, however, that many variations and modifications can be made while remaining within the scope of the present invention.

EXAMPLES

Typical System Dimensions

Hollow Cathode Slot System for Coating a 15 cm Film

First compartment (rectangular box with cathode tube): Inside dimensions (2.5 cm H, 15.2 cm W, 4.0 cm L); Outside dimensions (6.4 cm H, 17.1 cm W, 5.0 cm L).

Quartz plate between first and second compartments: 5.2 cm H, 20.3 cm W, 0.3 cm L with a 0.6 cm diameter circular hole.

Second compartment: Inside dimensions (5.3 cm H, 14.7 cm W, 3.8 cm L); Outside dimensions (6.0 cm H, 15.4 cm W, 3.8 cm L). Quartz plate between second and third compartments: 11.7 cm H, 20.3 cm W, 0.3 cm L with a 13.2 cm by 0.4 cm slot.

Third compartment: Inside dimensions (8.0 cm H, 15.1 cm W, 9.5 cm L); Outside dimensions (9.1 cm H, 20.5 cm W, 9.5 cm L); Electrode plates (15.1 cm W, 5.5 cm L) with a slot created between the two electrode plates of 0.6 cm high.

Front quartz plate: 12.0 cm H, 22.7 cm W, 0.3 cm L with a 17.6 cm by 2.0 cm slot.
Hollow Cathode Slot System for Coating a 30 cm Film First compartment: Water-cooled coils (6.5 cm outside diameter) around 9.8 cm cathode tube (4.0 cm inside diameter).

Quartz plate between first and second compartments: 7.0 cm H, 38.1 cm W, 0.6 cm L with a 2.3 cm×1.5 cm diameter oval hole.

Second compartment: Inside dimensions (6.3 cm H, 37.5 cm W, 3.9 cm L); Outside dimensions (6.9 cm H, 38.1 cm W, 3.9 cm L).

Quartz plate between second and third compartments: 10.3 cm H, 39.6 cm W, 0.3 cm L with a 30.1 cm by 0.5 cm slot.

Third compartment: Inside dimensions (6.7 cm H, 29.1 cm W, 9.5 cm L); Outside dimensions (10.2 cm H, 34.1 cm W, 9.5 cm L); Electrode plates (11.1 cm W, 4.8 cm L) with a slot created between the two electrode plates of 0.8 cm high.

Front quartz plate: 10.1 cm H, 39.5 cm W, 0.3 cm L with a 30.5 cm by 2.5 cm slot.
Power Supply Description The Airco Temescal CL-2A power supply consists of a leakage type power transformer that supplies AC power to a full wave bridge rectifier to yield an output, which is the absolute value of the transformer output voltage, i.e., the negative absolute value of a sine wave starting at zero volts and going to a peak negative value of about 5000 volts open circuit. Under a purely resistive load of 100 ohms, this power supply would rise to a voltage of minus 200 volts with the current limited at 500 mA. With an arc plasma as a load, the output voltage of the power supply climbs to the breakdown voltage of the apparatus and then the voltage drops immediately to the arc steady state voltage with current limited to 500 mA. Thus, the leakage transformer employed acts to limit current flow through the load or plasma in a manner similar to a resistive ballast in a typical glow discharge system. More specifically, as the cycle of power supply output voltage (starting at $T_0$) progresses through the 120 Hz waveform (starting at zero output volts), the voltage increases with time to a negative voltage value significantly above the arc steady state voltage. At this point, voltage breakdown occurs in the plasma jet, an arc is established, and the power supply output drops to the arc steady state voltage of about minus 100 volts and the saturation current of the power transformer, about 500 mA for the CL-2A power supply. As time progresses through the cycle, the power supply voltage drops below the arc voltage and the arc extinguishes. The power supply output voltage continues to drop, reaching zero volts at $T_0+1/120$ second and the process starts again. The time period for this entire cycle is 1/120 of a second, or twice the frequency of the AC line input voltage to the power supply. The operations of the 1 amp power supply and the 10 amp power supply are identical except that the limiting currents are 1 amp and 10 amps respectively.

Example 1

Carbon-rich coatings were deposited on silicon chips which were placed onto 15 cm wide and 1 mil ($2.54 \times 10^{-3}$ cm) thick Kapton™ film, obtained from DuPont de Nemours (Wilmington, Del.), Type 100H. The silicon chips were about 1 cm×3 cm, partly masked, and positioned across the Kapton™ film. The silicon chips were passed at a speed of about 5 cm per second repeatedly over the biased chill roll by virtue of the Kapton™ film which was transported in loop form over the biased chill roll and the two rolls of the web drive system. The hollow cathode slot was about 15 cm wide and the graphite plates had a gap of about 0.6 cm. The chill roll was 5 cm in diameter, 18 cm long, chilled to 5° C. and about 6.5 cm away from the hollow cathode slot. The grounding box, i.e., anode, was about 20 cm wide and included a 3 mm graphite rod which was electrically heated to a red hot temperature. All power supplies, including the anode, were connected to a common ground (i.e., ground 100 in FIG. 1). After the vacuum chamber was evacuated to a pressure of about 1 mTorr (0.13 Pa), argon flows between 50 sccm and 100 sccm were introduced into the argon plasma chamber, i.e., the first compartment of the hollow cathode slot system described herein. The plasma was sustained at about minus 450 volts and at a pulsating DC current of 0.5 amps using the Airco Temescal Model CL-2A power supply (maximum output of 0.5 amp). The acetylene flow rates were varied between 50 and 336 sccm and introduced into the mixing chamber, i.e., the second compartment of the hollow cathode slot system described herein. The hollow cathode slot was powered by the 25 kilowatt nonpulsating filtered DC power supply from Hippotronics. The current was varied between 4800 mA and 10,000 mA. The experiments at 1000 mA, however, were conducted with a pulsating DC power supply having a maximum output of 1 amp powering the cathode slot. The following table shows the deposition rates under varying conditions. The deposition rate was determined from the deposition time and the coating thickness. The deposition time was calculated from the web speed and the deposition area which was about 5 cm×15 cm. The coating thickness was determined by a step profilometer manufactured by Tencor Instruments, Mountainview, Calif., which measured with sufficient accuracy the step between the masked and repeatedly coated areas.

| FLOW RATES | | HOLLOW CATHODE SLOT | | |
| --- | --- | --- | --- | --- |
| | | CURRENT | VOLTAGE | |
| sccm $C_2H_2$ | sccm Ar | (mA) | (V) | Å/second |
| 50 | 100 | 1000 | −100 | 28 |
| 100 | 100 | 1000 | −90 | 49 |
| 258 | 60 | 4800 | −92 | 309 |
| 258 | 60 | 4900 | −95 | 363 |
| 336 | 50 | 9000 | −100 | 743 |
| 336 | 50 | 10000 | −100 | 754 |

Example 2 (Comparative)

Carbon-rich coatings were deposited on 15 cm wide, 1 mil ($2.54 \times 10^{-3}$ cm) thick Kapton™ 100H film and silicon chips. The jet plasma process was used as described in U.S. Pat. Nos. 5,286,534 and 5,232,791 (Kohler et al.). The hollow cathode was a graphite tube 2.5 cm in diameter, 10 cm long, and 21 cm away from the substrate. The substrate was in contact with a water-cooled copper plate functioning as the bias electrode. The anode was a nichrome wire loop (approximately 30 cm in diameter) in between the hollow cathode tube and the substrate. Argon (50 sccm) and acetylene (150 sccm) were introduced into the hollow cathode tube. A plasma was generated by powering the hollow cathode tube with a 1 ampere maximum output pulsating DC power supply. Deposition time was 1 minute for the stationary samples. As shown in FIG. 3, the deposition rate increased with increasing current accompanied by a significant increase in voltage.

Example 3

Carbon-rich coatings were deposited on 30 cm wide, 0.56 mil ($1.4 \times 10^{-3}$ cm) video grade polyethylene terephthalate film having therein less than about 1% of an $SiO_2$ slip agent (OX-50 from Degussa of Germany), which had been corona treated and wrapped for storage and handling in a packaging film with moisture barrier characteristics (manufactured by Minnesota Mining and Manufacturing Company, St. Paul, Minn.), using two pulsating DC power supplies (1 ampere and 10 amperes maximum output). The hollow cathode slot was 10 cm wide and the copper plates had a gap of about 0.8 cm. The chill roll was 48 cm in diameter, 32 cm wide, cooled to about 5° C. and 9 cm away from the front of the hollow cathode slot. The anode system was placed in between and below an imaginary line between the chill roll and the hollow cathode slot, and connected to the two pulsating DC power supplies. After the vacuum chamber was evacuated to a pressure of about 1 mTorr (0.13 Pa), 40 sccm argon was introduced into the argon plasma chamber, i.e., the first compartment of the preferred hollow cathode slot system of the present invention, through an elongated passageway. A plasma was created and sustained at minus 200 volts at 1 ampere using a pulsating DC power supply having a maximum output of 1 amp. Acetylene (460 sccm) was introduced into the mixing chamber, i.e., the second compartment of the hollow cathode slot system of the present invention. The third compartment of the hollow cathode slot system containing the hollow cathode plates was connected to a 10 ampere maximum output pulsating DC power supply. At a voltage of minus 100 volts, a stable plasma was generated using a current flow of 10 amperes. The bias voltage was kept at minus 720 volts. The pressure was at about 6 mTorr (0.80 Pa). At a web speed of about 15 m/minute, a carbon-rich coating of 100–200 Å was obtained with good cross-web and down-web uniformity, as evidenced by water vapor permeability values of about 1.3–1.6 $g/m^2$-day (measured with a Permatran W-6 Permeability Tester manufactured by Modem Controls, Inc., Minneapolis, Minn. using ASTM test method F 1249-90—aluminum foil standard for calibration, sample conditioned overnight, cell filled half-way with deionized water, 60 minute test with a gas pressure of 15 psi ($1.0 \times 10^5$ Pa)).

Example 4

The 10 ampere maximum output pulsating DC power supply used in Example 3 was replaced by a high current 25 kilowatt nonpulsating filtered DC power supply available from Hippotronics (Model No. 803-8.8A). The apparatus arrangement, the gas flow rates, and the pressure were the same as described in Example 3. The argon plasma was sustained at minus 500 volts and 1 ampere current. The hollow cathode slot had a voltage of minus 95 volts at 9 amperes. The bias voltage was kept at minus 900 volts. At a web speed of about 20 m/minute, 600 meters of the PET film used in Example 3 were coated with a carbon-rich coating. The coating was 100–200 Å thick and had water vapor permeability values of 1–2 $g/m^2$-day, measured as described in Example 3. After heat lamination (i.e., overcoating with about 1 mil ($2.54 \times 10^{-3}$ cm) of corona-treated ethylene butene copolymer available under the tradename EXACT 3027 from Exxon Chemical Company, Houston, Tex.), the water vapor permeability values were below 1 $g/m^2$-day. In a series of experiments, carbon coated and laminated samples were folded several times. The PET film containing only the carbon-coating, which was folded twice, showed an increase in water vapor permeability to about 10 $g/m^2$-day, although this value was still lower than the PET film alone (30 $g/m^2$-day) or the PET film with the polymer laminated onto it without the carbon coating (18 $g/m^2$-day). The laminated samples containing the carbon coating and ethylene butene overcoat, however, which were folded up to six times, revealed a high degree of flexibility which resulted in a slow deterioration of the barrier properties. That is, the water vapor permeability values increased slightly, but remained below about 2 $g/m^2$-day. Thus, the carbon coatings prepared by the method of the present invention can be used on flexible substrates, and are particularly advantageous for packaging applications, for example, when used in combination with a polymer overcoating.

Example 5

Carbon-rich coatings were deposited on a 15 cm wide, 0.56 mil ($1.4 \times 10^{-3}$ cm) video grade dual layer polyethylene terephthalate—only one layer of which contained less than about 1% of an $SiO_2$ slip agent (OX-50 from Degussa of Germany)—previously wrapped for storage and handling in a packaging film with moisture barrier characteristics), manufactured by Minnesota Mining and Manufacturing Company (St. Paul, Minn.). The hollow cathode slot was about 15 cm wide and the graphite plates had a gap of about 0.6 cm. The chill roll was 5 cm in diameter, 18 cm long, chilled to 5° C. and about 6.5 cm away from the hollow cathode slot. The anode box was about 23 cm wide and included a 3 mm graphite rod which was electrically heated to red-hot temperature. All power supplies including the anode box were connected to a common ground. After the vacuum was evacuated to a pressure of about 1 mTorr (0.13 Pa), 50 sccm argon was introduced into the argon plasma chamber where a plasma was sustained at minus 450 volts and at a pulsating DC current of 0.5 amp using the Airco Temescal Model CL-2A power supply (maximum output of 0.5 amp). Acetylene (258 sccm) was introduced into the mixing chamber. The hollow cathode slot was powered by the 25 kilowatt nonpulsating filtered DC power supply from Hippotronics. A slightly unstable plasma was sustained at minus 100 volts and around 4.2 amps. The bias voltage was kept at minus 700 volts. The pressure was 11 mTorr (1.43 Pa). At a web speed of 6 m/minute, a carbon-rich coating was obtained with varying degrees of down-web uniformity. The PET film was coated on the side that did not contain the $SiO_2$ slip agent. Various samples along the length of the PET film were evaluated for barrier properties. The water vapor permeability values varied between 0.5 g/m²-day and 3 g/m²-day. This variability is probably due to the variation of acetylene fragmentation. Mass spectrometry in fact showed a variation in the unfragmented portion of the acetylene feed gas with time. Consequently, a variation of carbon-rich coating thickness is evidenced, which thereby causes a variation in barrier properties. In contrast, mass spectrometry indicated a constant rate of acetylene fragmentation with time when a pulsating DC power supply was used.

Example 6

Figure 5A:
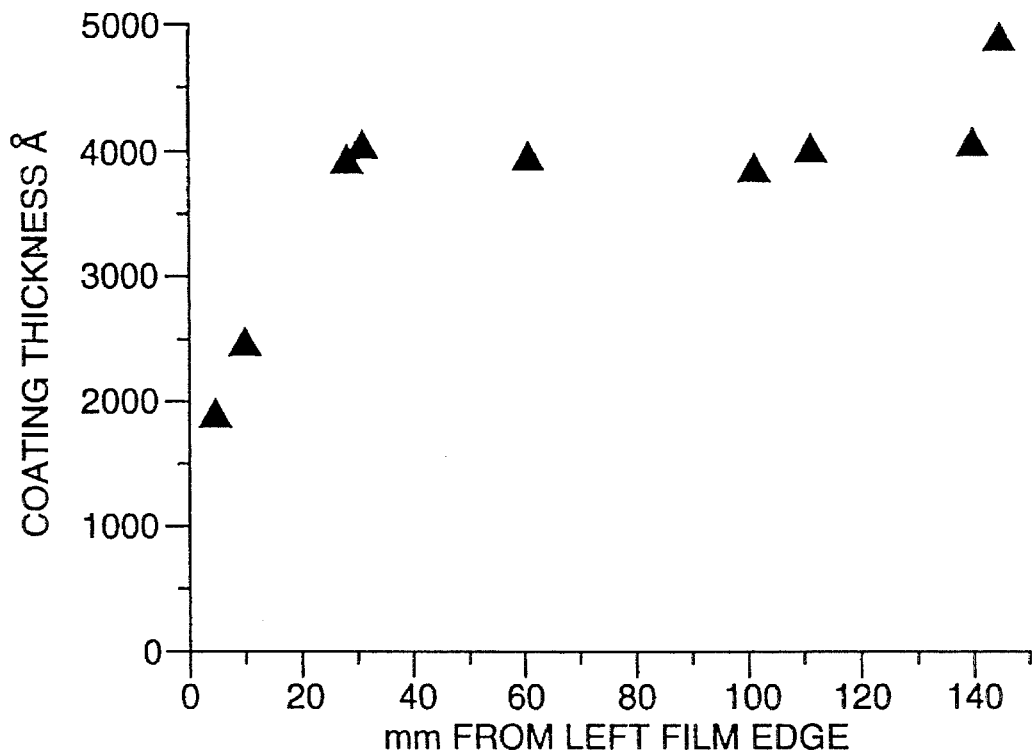
FIGS. 5 A, B, C, D, E and F are plots of coating thickness in angstroms along the width of a polyester film (mm from left edge): (A) No special anode system; (B) Slot opening of adjustable anode system=1–2 cm; (C) Center 150 mm of anode slot blocked; (D) Right half of anode slot blocked, cathode slot not blocked; (E) Right half of cathode slot blocked, anode slot not blocked; and (F) Right halves of cathode slot and anode slot blocked.
Figure 5B:
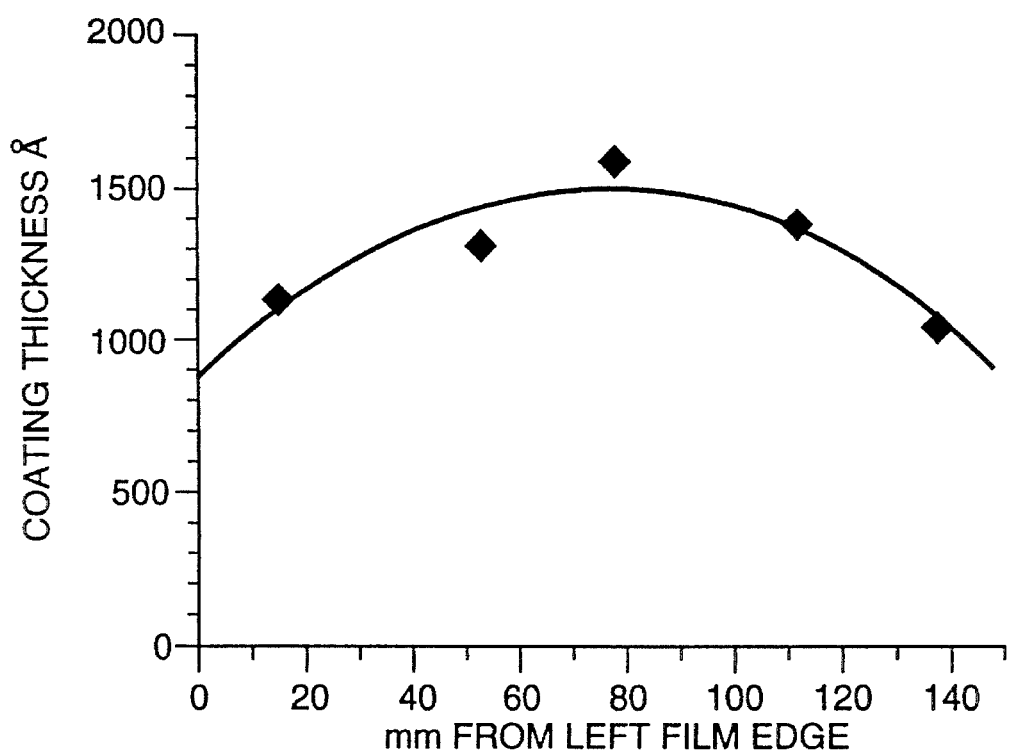
Figure 5C:
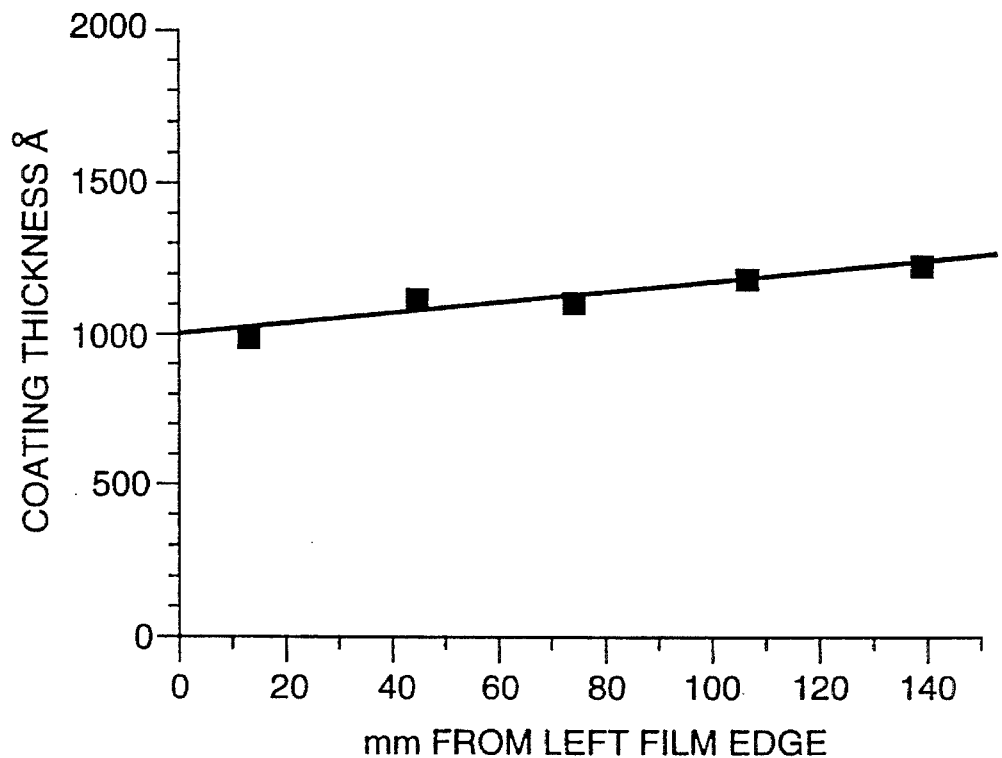
Figure 5D:
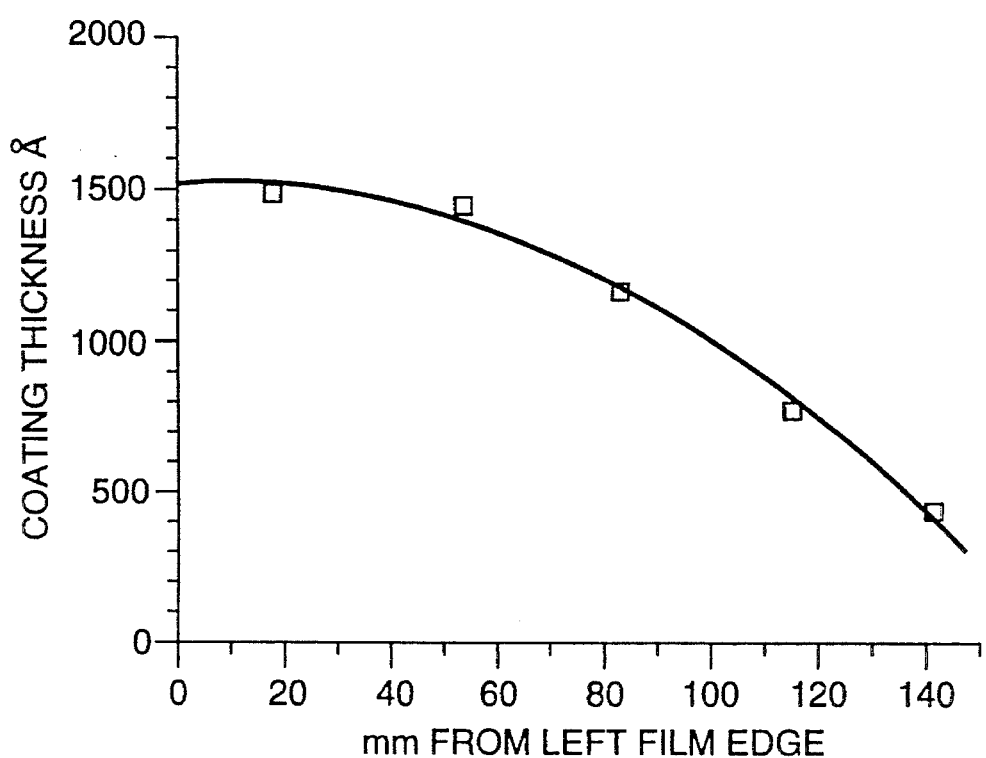
Figure 5E:
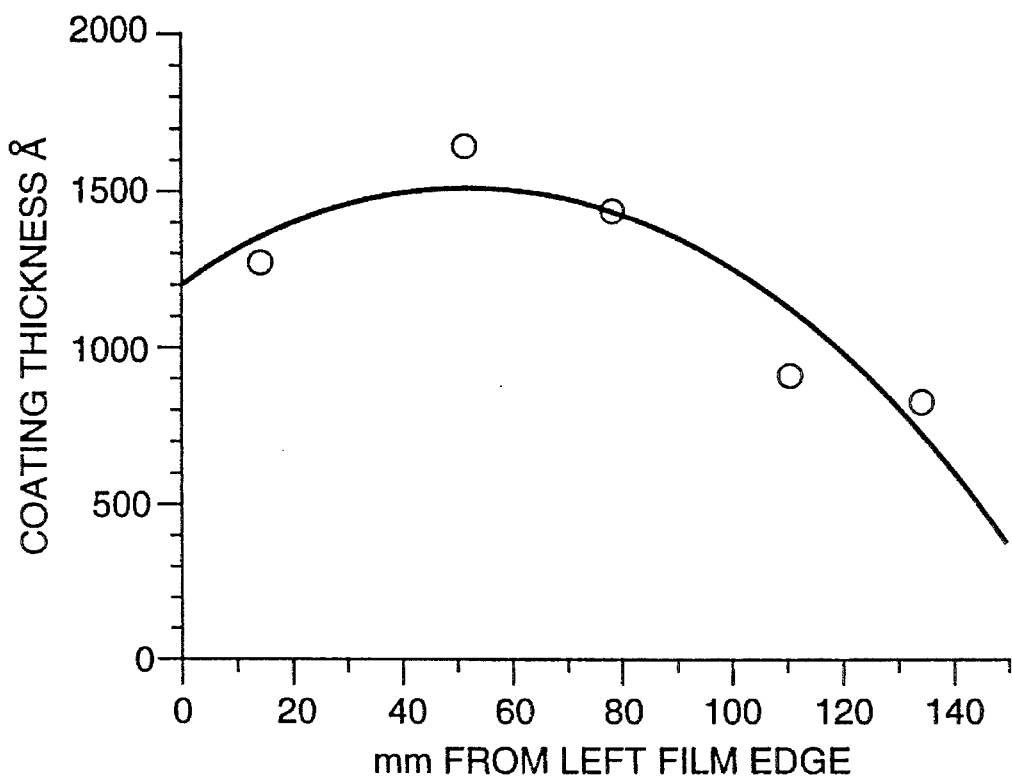
Figure 5F:
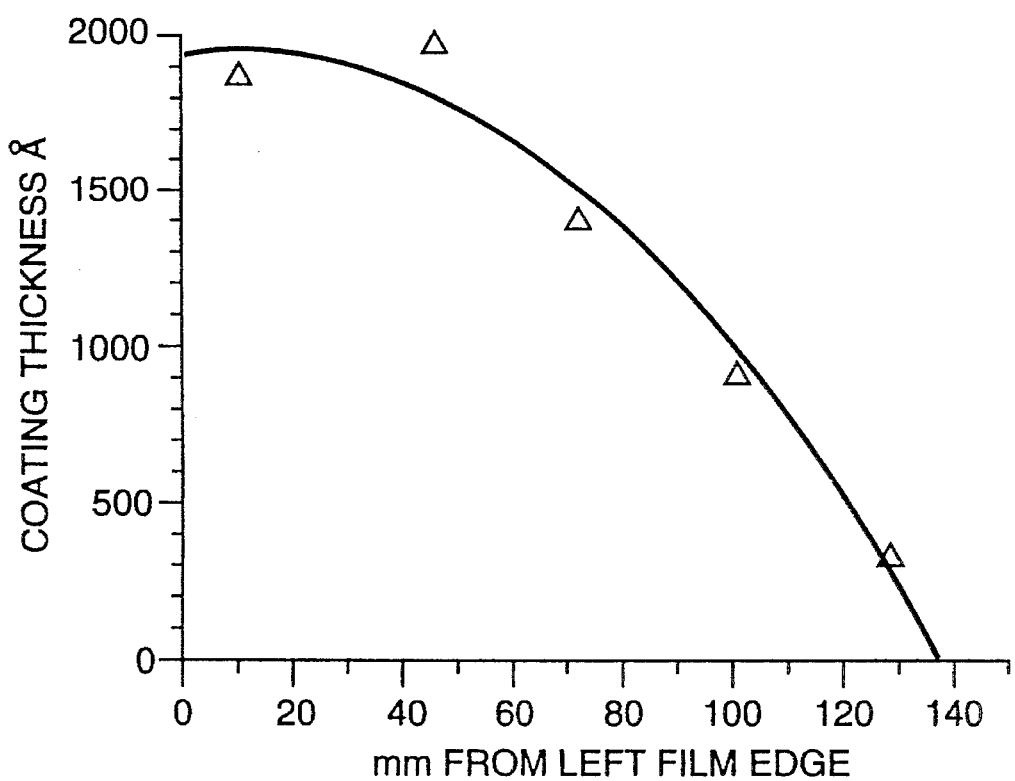

A series of experiments were conducted using the 15 cm coating apparatus described in Example 5 with a 1 ampere maximum output pulsating DC power supply in place of the nonpulsating filtered DC power supply. FIG. 5A shows a very non-uniform coating thickness on the PET film used in Example 5. The coating was obtained using as a ground the plasma chamber itself. In addition, a ground wire loop was placed in front of the hollow cathode without paying attention to any symmetric arrangement in reference to the cathode. A comparison of FIG. 5A with 5B points out the improvement in cross-web uniformity when the anode system is employed. The symmetry of the deposition pattern (with the heaviest deposition in the center) indicates the importance of the designed symmetric cathode-ground arrangement that appears to be ultimately responsible for the arrangement of the electric field pattern and consequently for the controlled deposition conditions. FIG. 5C substantiates that small changes in the symmetry of the anode system have a significant effect on the change of the deposition pattern. FIG. 5C shows that uniform coating thickness over the total deposition width is achievable by a small modification of the ground slot opening, i.e., the center of the grounding slot is blocked with a glass slide. FIGS. 5D and 5E give further evidence that any distortion or partial blocking of the electric field pattern results in a certain deposition pattern. In FIG. 5D the right half of the grounding slot is blocked resulting in decreased coating thickness on the right side. The deposition pattern is similar in FIG. 5e although the experimental arrangement is quite different, i.e., the right side of the cathode slot, as opposed to the grounding slot, is blocked. The similarity of the coating pattern and the amount of carbon deposited in FIGS. 5D and 5E indicates that the deposition is controlled or at least significantly influenced by the intensity of the electric field pattern established between cathode and anode (ground) regardless of where the blocking occurs either at the slot of the hollow cathode or at the slot of the anode system. FIG. 5F shows the deposition pattern when the right halves of both the grounding slot and the cathode slot are blocked.

Example 7

Carbon-rich coatings were deposited on various 15 cm wide polymer film substrates. The hollow cathode slot was about 15 cm wide and the graphite plates had a gap of about 0.6 cm. The radio frequency bias electrode was a water cooled copper plate (20 cm×25 cm) which was situated 5.5 cm away from the hollow cathode slot. A ground wire loop (about 35 cm in diameter) was placed in between the hollow cathode box and the substrate. The hollow cathode slot was powered by a 1 ampere maximum output pulsating DC power supply at 1000 mA and about minus 100 volts. The film substrates were coated either stationary while in contact with the bias electrode plate or continuously sliding over the plate at a constant speed. The following table shows water vapor permeability values for the substrate prior to ("substrate") and after ("sample") carbon deposition, measured using a Permatran W-6 Permeability Tester and the method outline in Example 3. Excellent barrier values were obtained for all substrates including the 4 mil (1.0×10⁻² cm) PET film which was not pretreated either by corona or other plasma (argon) treatments, nor was it specially packaged to avoid water absorption or made with a slip agent.

| Substrate Material | $H_2O$ PERMEABILITY g/m²-day | | Bias Voltage (volts) | Exposure Time (sec) | $C_2H_2$/Ar (sccm) |
|---|---|---|---|---|---|
| | Substrate | Sample | | | |
| 1 mil (2.54 × 10⁻³ cm) polypropylene Mobil Chem. Co. LBW 100 | 4.3 | 0.7866 | −1200 | 8 stationary | 150/100 |
| 0.72 mil (1.8 × 10⁻³ cm) Nylon Allied Signal Biaxially oriented #113761 | 7.8 | 0.7066 | −1200 | 4 stationary | 150/100 |
| Ethylene vinyl alcohol | 2.4 | 0.2291 | −1200 | 8 stationary | 150/100 |

| Substrate Material | H$_2$O PERMEABILITY g/m$^2$-day Substrate | Sample | Bias Voltage (volts) | Exposure Time (sec) | C$_2$H$_2$/Ar (sccm) |
|---|---|---|---|---|---|
| -continued | | | | | |
| EF-XL (3M) 1 mil (2.54 × 10$^{-3}$ cm) Kapton ™ (polyimide-100H) DuPont | 38.0 | 0.6133 | −1200 | 8 stationary | 150/100 |
| Polycarbonate 7 mil (1.8 × 10$^{-2}$ cm) Mobay Brand clear, DE11 | 21.5 | 0.0666 | −1200 | 8 stationary | 150/100 |
| 4 mil (1.0 × 10$^{-2}$ cm) PET (3M) | 3.9 | 0.0533 | −300 | 60 continuous | 150/100 |
| 4 mil (1.0 × 10$^{-2}$ cm) PET (3M) | 3.9 | 0.7619 | −600 | 12 continuous | tetramethyl silane/Ar 150/80 |

Example 8

The hollow cathode system used in Example 3 was replaced by a graphite tube (as described in U.S. Pat. Nos. 5,286,534 and 5,232,791) 0.6 cm in inner diameter and about 15 cm long. The feed and carrier gases (460 sccm C$_2$H$_2$ and 40 sccm argon) were introduced as a mixture into the tube. Otherwise the apparatus arrangement, including the placement of the anode system and distance of the cathode tube orifice to the substrate, was the same as described in Example 3. Carbon-rich coatings were deposited on 30 cm wide, 0.56 mil (1.4×10$^{-3}$ cm) video grade dual layer PET film (described in Example 5) at a plasma arc current of 10 amps and minus 75 volts at a speed of 14 m/minute using the pulsating 10 ampere maximum output power supply. The pressure was about 8 mTorr (1.0 Pa) and the bias voltage was minus 600 volts. Water vapor permeability tests (measured as described in Example 3) indicated variation in cross-web uniformity ranging from about 8 g/m$^2$-day at the outer portions to about 0.5 g/m$^2$-day at the center. The non-uniformity was attributed to the carbon plasma generated from a small cathode tube orifice, which can be considered a point source. Based on these results, higher cross-web uniformity is expected by an adequate change in the configuration of the anode system.

Example 9

One mil (2.54×10$^{-3}$ cm) Kapton™ film (DuPont, H100) and 1 mil (2.54×10$^{-3}$ cm) aluminum foil (both 15 cm wide) were carbon coated according to the apparatus arrangement and most of the process conditions described in Example 5. The hollow cathode slot plasma was sustained at about minus 100 volts and 6 amps. The pressure was around 8–10 mTorr (1.0–1.3 Pa). The carbon coated Kapton™ film was evaluated by ESCA, optical transmission and water vapor permeability. Carbon was deposited under stationary conditions on aluminum foil within 2–3 minutes and then scraped off for use in an analysis by Raman spectroscopy. In addition, the aluminum foil was used as a substrate holder for Ge-FTIR crystals and for silicon chips to measure thickness and hardness of the deposited carbon.

| SAMPLE | A | B | C | UNCOATED KAPTON ™ FILM |
|---|---|---|---|---|
| C$_2$H$_2$/AR (sccm) | 200/50 | 200/50 | 100/100 | |
| BIAS VOLTAGE (Volts) | 0 | −300 | −300 | |
| DEPOSITION RATE (Å/sec) | 107 | 117 | 40 | |
| WEB SPEED (mm/sec) | 17.5 | 17.5 | 8.7 | |
| H$_2$O PERMEABILITY (g/m$^2$-day) | 8.857 | 1.195 | 0.857 | 38.0 |
| ESCA Atom percent C/O | 83.2/16.8 | 85.2/14.8 | 85.5/14.5 | |
| OPTICAL TRANSMISSION (% at 600 nm) | 70.8 | 70.1 | 71.0 | 73.4 |
| HARDNESS (Mohs) | <5 | 6–7 | 7–8 | |

For sample A the following IR absorption peaks were observed:

| WAVE NUMBER (cm$^{-1}$) | ASSIGNMENT | |
|---|---|---|
| 2970–2960 | sp$^3$ CH$_2$ | (asymmetrical) |
| 2925–2920 | sp$^3$ CH$_2$ | (asymmetrical) |
| 2875–2870 | sp$^3$ CH$_2$ | (symmetrical) |
| 1700–1660 | C=O | |
| 1570–1600 | C=C | |
| 1430–1450 | sp$^3$ CH$_3$ | (asymmetrical) |
| 1370–1380 | sp$^3$ CH$_3$ | (symmetrical) |
| 1250–1220 | C—O | |

In essence, sample A contained a significant concentration of hydrocarbon moieties along with a significant portion of unsaturated and oxidized carbon. Comparing the absorbance peak heights of sample A with those of sample B (processed with a bias voltage of minus 300 volts) the hydrocarbon portion of sample B was reduced by about 40% and the oxidized carbon portion was reduced by about 10–20%; the unsaturated carbon portion, however, increased by about 15–20%. For sample C, (compared with sample A) similar but slightly greater compositional changes were obtained by employing somewhat more intense plasma conditions. The C=O peak was reduced to near zero in sample B and completely eliminated in sample C. These results indicate that different types of carbon-rich coatings were deposited using the varied deposition conditions, with samples B and C approaching that of a diamond-like coating.

Raman spectra of sample B and C were essentially flat except for peaks at 1330–1334 cm$^{-1}$ and a larger and sharper peak at 1580–1583 cm$^{-1}$, which was indicative of the presence of a graphitic component. The Mohs hardness values of samples B and C approached that of diamond (about 10).

The present invention has been described with reference to various specific and preferred embodiments and techniques. It should be understood, however, that many variations and modifications may be made while remaining within the spirit and scope of the invention.

What is claimed is:

1. A process for the plasma deposition of a carbon-rich coating onto a substrate comprising:
    (a) providing a substrate in a vacuum chamber;
    (b) generating a carbon-rich plasma in the vacuum chamber by:
        (1) injecting a plasma gas into a hollow cathode slot system containing a cathode comprising two electrode plates arranged parallel to each other;
        (2) providing a sufficient voltage to create and maintain a carbon-rich plasma in the hollow cathode slot system; and
        (3) maintaining a vacuum in the vacuum chamber sufficient for maintaining the plasma; and
    (c) depositing the carbon-rich plasma on the substrate to form a carbon-rich coating.

2. The process of claim 1 wherein the step of depositing the carbon-rich plasma comprises exposing the substrate to the plasma while the substrate is in close proximity to a radio frequency bias means; whereby the plasma is accelerated toward the substrate and is deposited thereon as a carbon-rich coating.

3. The process of claim 1 wherein the hollow cathode slot system includes a first compartment having therein a hollow cathode tube, a second compartment connected to the first compartment, and a third compartment connected to the second compartment having therein the two parallel plates.

4. The process of claim 3 wherein the voltage is provided by a first pulsating DC power supply connected to the hollow cathode tube and a second pulsating DC power supply connected to the two electrode plates.

5. The process of claim 4 wherein the plasma is accelerated toward the substrate past an anode system that is connected to both pulsating DC power supplies.

6. The process of claim 4 wherein the second pulsating DC voltage power supply has a maximum current of 10 amperes.

7. The process of claim 3 wherein the step of injecting a plasma gas comprises injecting a carrier gas into the first compartment and a feed gas into the second compartment.

8. The process of claim 7 wherein a plasma is formed from the carrier gas in the first compartment.

9. The process of claim 8 wherein a plasma is formed from the carrier gas and the feed gas in the third compartment.

10. The process of claim 9 wherein the feed gas is selected from the group consisting of saturated and unsaturated hydrocarbons, nitrogen-containing hydrocarbons, oxygen-containing hydrocarbons, halogen-containing hydrocarbons, and silicon-containing hydrocarbons.

11. The process of claim 10 wherein the feed gas is acetylene.

12. The process of claim 1 wherein the radio frequency bias means is a chill roll and the substrate contacts the chill roll during deposition of the carbon-rich coating.

13. The process of claim 1 wherein the plasma is accelerated toward the substrate past an anode system.

14. The process of claim 1 wherein the carbon-rich coating is deposited at a deposition rate of about 750 Å/second.

15. A jet plasma deposition apparatus comprising a cathode system for generating a plasma and an anode system; wherein said cathode system comprises a hollow cathode slot system containing a compartment having therein a cathode comprising two electrode plates arranged parallel to each other.

16. The jet plasma deposition apparatus of claim 15 wherein the hollow cathode slot system includes a first compartment having therein a hollow cathode tube, a second compartment connected to the first compartment, and a third compartment connected to the second compartment having therein the two parallel electrode plates.

17. The jet plasma deposition apparatus of claim 16 wherein the hollow cathode tube is connected to a first pulsating DC power supply and the two electrode plates are connected to a second pulsating DC power supply.

18. The jet plasma deposition apparatus of claim 15 further including a bias electrode.

19. The jet plasma deposition apparatus of claim 18 wherein the anode system is an adjustable anode system located substantially below an imaginary line connecting the slot of the hollow cathode slot system and the bias electrode so as to be below the path of the plasma travelling between the cathode and the bias electrode when in operation.

20. A jet plasma deposition apparatus comprising a cathode system for generating a plasma and an adjustable anode system located substantially below the path the plasma travels when in operation.

21. The jet plasma deposition apparatus of claim 20 further including a bias electrode.

22. The jet plasma deposition apparatus of claim 20 wherein the cathode system is a hollow cathode slot system that includes:
    (a) a first compartment having therein a hollow cathode tube; said compartment and tube connected to a first pulsating DC power supply;

(b) a second compartment connected to the first compartment; and (c) a third compartment connected to the second compartment and having therein a cathode comprising two electrode plates arranged parallel to each other; said cathode connected to a second pulsating DC power supply.

23. The jet plasma deposition apparatus of claim 22 wherein the second pulsating DC power supply has a maximum current of 10 amperes.

24. A jet plasma deposition apparatus comprising:

(a) a hollow cathode slot system for generating a plasma comprising:
  (i) a first compartment having therein a hollow cathode tube;
  (ii) a second compartment connected to the first compartment; and
  (iii) a third compartment connected to the second compartment; wherein the third compartment has therein two electrode plates arranged parallel to each other;

(b) an adjustable anode system located substantially below the path the plasma travels when in operation; and (c) a bias electrode.

25. The jet plasma deposition apparatus of claim 24 wherein the hollow cathode tube is connected to a first pulsating DC power supply.

26. The jet plasma deposition apparatus of claim 25 wherein the two electrode plates are connected to a second pulsating DC power supply.

27. The jet plasma deposition apparatus of claim 26 wherein the anode system is connected to both pulsating DC power supplies.

28. The jet plasma deposition apparatus of claim 26 wherein the second pulsating DC power supply has a maximum current of 10 amperes.

29. The jet plasma deposition apparatus of claim 24 wherein the bias electrode is a chill roll.

30. The jet plasma deposition apparatus of claim 24 wherein the second compartment includes a feed gas inlet tube.

* * * * *